United States Patent
Kirihara et al.

(10) Patent No.: US 9,059,336 B2
(45) Date of Patent: Jun. 16, 2015

(54) THERMOELECTRIC CONVERSION ELEMENT

(75) Inventors: Akihiro Kirihara, Tokyo (JP); Masahiko Ishida, Tokyo (JP); Shigeru Koumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/346,796

(22) PCT Filed: Aug. 8, 2012

(86) PCT No.: PCT/JP2012/070269
§ 371 (c)(1),
(2), (4) Date: Mar. 24, 2014

(87) PCT Pub. No.: WO2013/046948
PCT Pub. Date: Apr. 4, 2013

(65) Prior Publication Data
US 2014/0224293 A1    Aug. 14, 2014

(30) Foreign Application Priority Data
Sep. 26, 2011   (JP) ................. 2011-209727

(51) Int. Cl.
*H01L 37/00* (2006.01)
*H01L 43/06* (2006.01)
(Continued)

(52) U.S. Cl.
CPC ............. *H01L 37/00* (2013.01); *H01L 43/06* (2013.01); *H01L 35/12* (2013.01); *H01L 35/02* (2013.01); *H01L 37/04* (2013.01); *H01L 31/18* (2013.01);
(Continued)

(58) Field of Classification Search
CPC .......... H01L 35/00; H01L 43/08; H01L 43/06
USPC .................................. 136/200–293; 257/421
See application file for complete search history.

(56) References Cited

U.S. PATENT DOCUMENTS

| | | | | |
|---|---|---|---|---|
| 2010/0276770 A1* | 11/2010 | Uchida et al. | ................. | 257/421 |
| 2011/0075476 A1* | 3/2011 | Kajiwara et al. | ............. | 365/170 |
| 2011/0084349 A1* | 4/2011 | Uchida et al. | ................. | 257/421 |

FOREIGN PATENT DOCUMENTS

| | | |
|---|---|---|
| JP | 2009-130070 A | 6/2009 |
| JP | 2009-295824 A | 12/2009 |

(Continued)

OTHER PUBLICATIONS

Gerrit E.W. Bauer, Spin caloritronics, Apr. 23, 2012, Nature Materials, vol. 11, 391-399.*

(Continued)

*Primary Examiner* — Matthew Martin
*Assistant Examiner* — Michael Y Sun
(74) *Attorney, Agent, or Firm* — Wilmer Cutler Pickering Hale and Dorr LLP

(57) ABSTRACT

A thermoelectric conversion element includes: a magnetic layer; a conductive film formed on the magnetic layer and configured to generate an electromotive force in an in-plane direction by inverse spin-Hall effect; and two terminal sections formed to contact with the conductive film at two portions whose potentials are different to each other by the electromotive force. Each of the two terminal sections contacts with the conductive film in a continuous or discrete contact surface. A longitudinal direction of a minimum rectangle which encompasses the continuous or discrete contact surface of each of the two terminal sections intersects with the direction of the electromotive force.

5 Claims, 17 Drawing Sheets

(51) Int. Cl.
   *H01L 35/12* (2006.01)
   *H01L 35/02* (2006.01)
   *H01L 37/04* (2006.01)
   *H01L 31/18* (2006.01)
   *G01K 7/36* (2006.01)
   *B01J 19/08* (2006.01)
   *F25B 21/02* (2006.01)

(52) U.S. Cl.
   CPC .. *G01K 7/36* (2013.01); *B01J 19/08* (2013.01); *F25B 21/02* (2013.01)

(56) References Cited

FOREIGN PATENT DOCUMENTS

JP     2010-245419 A    10/2010
   JP     2011-249746 A    12/2011
   WO     WO-2009/151000 A1 12/2009

OTHER PUBLICATIONS

International Preliminary Report on Patentability issued by the International Bureau of WIPO for International Application No. PCT/JP2012/070269 mailed Apr. 1, 2014 (6 pgs.).
   International Search Report corresponding to PCT/JP2012/070269 dated Oct. 23, 2012 (1 page).
   Uchida et al., "Spin Seebeck Insulator," Nature Materials, 2010, vol. 9, pp. 894-897.
   Uchida et al., "Observation of Longitudinal Spin—Seebeck Effect in Magnetic Insulators," Applied Physics Letters, 2010, vol. 97, 172505, (3 pages).

* cited by examiner

THERMOELECTRIC CONVERSION ELEMENT

CROSS-REFERENCE TO RELATED APPLICATIONS

This application is a national stage application of International Application No. PCT/JP2012/070269 entitled "Thermoelectric Conversion Element," filed on Aug. 8, 2012, which claims the benefit of the priority of Japanese patent application No. 2011-209727, filed on Sep. 26, 2011, the disclosures of each of which are hereby incorporated by reference in their entirety.

TECHNICAL FIELD

The present invention relates to a thermoelectric element which utilizes the spin-Seebeck effect and the inverse spin-Hall effect.

BACKGROUND ART

In recent years, the electronic technique called as the "spintronics" has attracted a lot of attentions. Conventional electronics has utilized only the "electric charge" which is one of the characteristics of the electron. In the spintronics, in addition to the electric charge, the "spin", which is another characteristic of the electron, is positively utilized. Specifically, the "spin current", which is a flow of the spin angular momentum of the electron, is an important concept. Since the energy dissipation of the spin current is small, there is a possibility of achieving an information transmission in high efficiency by utilizing the spin current. Therefore, the generation, detection, and control of the spin current are important themes.

For example, a phenomenon is known, in which a spin current is generated when an electric current flows. This is called as the "spin-Hall effect". Further, as an inverse phenomenon, it is known that an electromotive force is generated when a spin current flows. This is called as the "inverse spin-Hall effect". The spin current can be detected by utilizing the inverse spin-Hall effect. Note that, both of the spin-Hall effect and the inverse spin-Hall effect are relevantly developed in materials having large "spin orbit coupling" (e.g., Pt, Au).

Further, according to recent researches, the existence of the "spin-Seebeck effect" in magnetic bodies has become clear. The spin-Seebeck effect is a phenomenon in which a spin current is induced in the direction parallel to the temperature gradient when the temperature gradient is applied to the magnetic body (for example, refer to the patent literature 1, the non-patent literature 1, and the non-patent literature 2). Namely, due to the spin-Seebeck effect, the heat is converted into the spin current (heat-spin current conversion). In patent literature 1, the spin-Seebeck effect in an NiFe film being a ferromagnetic metal is reported. In non-patent literatures 1 and 2, the spin-Seebeck effect on the interface between the magnetic insulating body such as yttrium iron garnet (YIG, $Y_3Fe_5O_{12}$) and a metallic film is reported.

Note that, the spin current induced by the temperature gradient can be converted into the electric field (electric current, electric voltage) by utilizing the above-mentioned inverse spin-Hall effect. Namely, the "thermoelectric conversion" can be achieved in which the temperature gradient is converted into the electricity by utilizing both of the spin-Seebeck effect and the inverse spin-Hall effect.

FIG. 1 shows the structure of the thermoelectric conversion element disclosed in the patent literature 1. A heat-spin current conversion part 102 is formed on a sapphire substrate 101. The heat-spin current conversion part 102 has a laminated structure of a Ta film 103, a PdPtMn film 104, and an NiFe film 105. The NiFe film 105 has a magnetization of an in-plane direction. Further, a Pt electrode 106 is formed on the NiFe film 105, and the both edges of the Pt electrode 106 are connected to the terminals 107-1 and 107-2, respectively.

In the thermoelectric conversion element configured as said above, the NiFe film 105 has a function to generate a spin current from the temperature gradient due to the spin-Seebeck effect, and the Pt electrode 106 has a function to generate an electromotive force from the spin current due to the inverse spin-Hall effect. Specifically, when a temperature gradient is applied to the NiFe film 105 in an in-plane direction, a spin current is generated in the direction parallel to the temperature gradient due to the spin-Seebeck effect. Then, the spin current flows in from the NiFe film 105 to the Pt electrode 106, or flows out from the Pt electrode 106 to the NiFe film 105. In the Pt electrode 106, an electromotive force is generated in the direction orthogonal to the spin current and the NiFe magnetization direction due to the inverse spin-Hall effect. The electromotive force can be extracted from the terminals 107-1 and 107-2 formed on both edges of the Pt electrode 106.

As other related techniques, in patent literature 2, a spintronics device is disclosed, in which a spin wave spin current—pure spin current conversion is performed on the interface between a magnetic dielectric layer and a metal electrode. In patent literature 3, a microwave oscillation element which excites a microwave oscillation by injecting a pure spin current from a metal layer to a ferromagnetic layer is disclosed.

CITATION LIST

Patent Literature

Patent Literature 1: Japanese Patent Application Publication JP2009-130070A
Patent Literature 2: Japanese Patent Application Publication JP2009-295824A
Patent Literature 3: Japanese Patent Application Publication JP2010-245419A

Non-Patent Literature

Non-Patent Literature 1: Uchida et al., "Spin Seebeck insulator", Nature Materials, 2010, vol. 9, p. 894.
Non-Patent Literature 2: Uchida et al., "Observation of longitudinal spin-Seebeck effect in magnetic insulators", Applied Physics Letters, 2010, vol. 97, p172505.

SUMMARY OF THE INVENTION

In the thermoelectric conversion element as shown in FIG. 1, the amount of electricity generation can be increased by increasing the area of the metal electrode on which the inverse spin-Hall effect is developed. On the other hand, by increasing the area, the resistance loss (ohmic loss) at the metal electrode is disadvantageously increased.

An object of the present invention is to provide a technique for a thermoelectric conversion element in which the resistance loss can be reduced in a conductive film on which an inverse spin-Hall effect is developed.

According to an aspect of the present invention, a thermoelectric conversion element is provided. The thermoelectric conversion element includes: a magnetic layer; a conductive film formed on the magnetic layer and configured to generate an electromotive force in an in-plane direction by inverse spin-Hall effect; and two terminal sections formed to contact with the conductive film at two portions whose potentials are different to each other by the electromotive force. Each of the two terminal sections contacts with the conductive film in a continuous or discrete contact surface. A longitudinal direction of a minimum rectangle which encompasses the continuous or discrete contact surface of each of the two terminal sections intersects with the direction of the electromotive force.

According to an aspect of the present invention, a thermoelectric conversion element is provided. The thermoelectric conversion element includes: a magnetic layer; and a conductive film formed on the magnetic layer and configured to generate an electromotive force in an in-plane direction by inverse spin-Hall effect. The conductive film comprises two terminal sections at two portions whose potentials are different to each other by the electromotive force. A sheet resistance of the two terminal sections is lower than a sheet resistance of a part other than the two terminal sections.

According to an aspect of the present invention, a thermoelectric conversion element is provided. The thermoelectric conversion element includes: a magnetic layer; a conductive film formed on the magnetic layer and configured to generate an electromotive force in an in-plane direction by inverse spin-Hall effect; and two terminal sections formed to contact with the conductive film at two portions whose potentials are different to each other by the electromotive force. The two terminal sections and the conductive film is same in a width of an in-plane direction intersecting with a direction of the electromotive force.

According to the present invention, it is possible to reduce the resistance loss in a conductive film on which an inverse spin-Hall effect is developed in a thermoelectric conversion element.

BRIEF DESCRIPTION OF THE DRAWINGS

The above objects, other objects, effects, advantages, and characteristics of the present invention will become clearer by the description of exemplary embodiments with the accompanying drawings, in which.

DESCRIPTION OF EXEMPLARY EMBODIMENTS

The thermoelectric conversion element according to some exemplary embodiment of the present invention will be described below with reference to the accompanying drawings.

1. Thermoelectric Conversion Element

Figure 2:
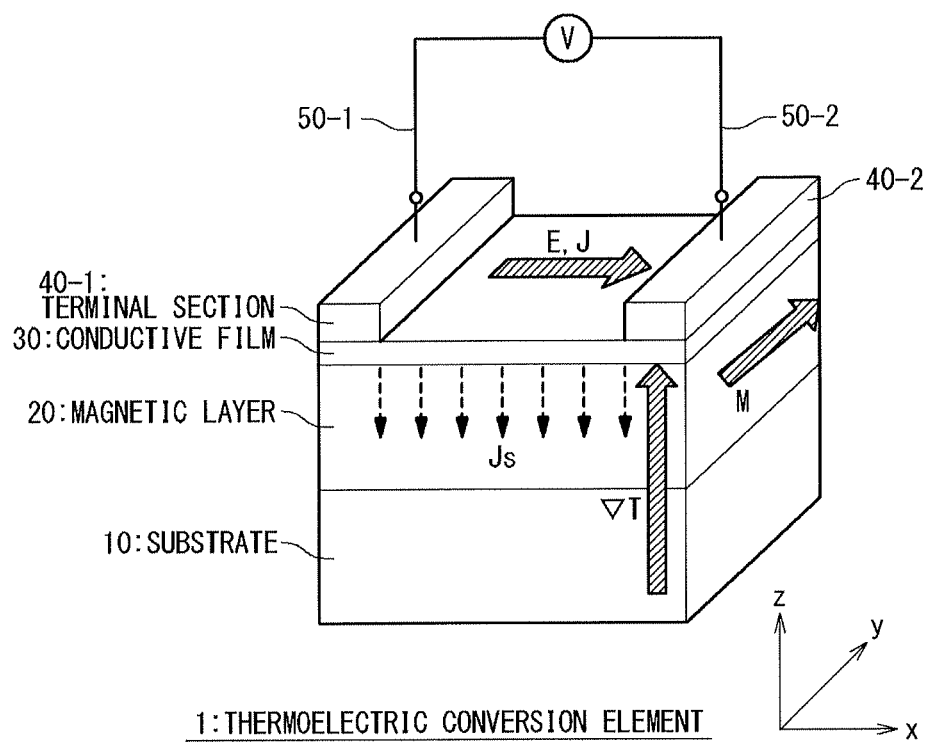
FIG. 2 is a perspective view schematically showing a structure of a thermoelectric conversion element according to an exemplary embodiment of the present invention.

FIG. 2 is a perspective view schematically showing a structure of a thermoelectric conversion element 1 according to this exemplary embodiment. The thermoelectric conversion element 1 includes a substrate 10, a magnetic layer 20, a conductive film 30, a pair of terminal sections 40 (40-1 and 40-2) and a pair of external connection wirings 50 (50-1 and 50-2). The magnetic layer 20 is formed on the substrate 10, and the conductive film 30 is formed on the magnetic layer 20. Namely, the substrate 10, the magnetic layer 20 and the conductive film 30 are laminated in this order. This lamination direction is hereinafter referred to as the z direction. The in-plane directions orthogonal to the z direction are the x direction and the y direction. The x direction and the y direction are orthogonal to each other.

The magnetic layer 20 is a heat-spin current converting section which develops the spin-Seebeck effect. Namely, the magnetic layer 20 generates (drives) a spin current Js from the temperature gradient ∇T due to the spin-Seebeck effect. The direction of the spin current Js is parallel or anti-parallel to the direction of the temperature gradient ∇T. In the example shown in FIG. 2, the temperature gradient ∇T of the +z direction is applied, and the spin current Js along the +z direction or −z direction is generated.

The material of the magnetic layer 20 may be a ferromagnetic metal or a magnetic insulating body. As the ferromagnetic metal, NiFe, CoFe, CoFeB and the like are listed. As the magnetic insulating body, yttrium iron garnet (YIG, $Y_3Fe_5O_{12}$), YIG (Bi:YIG) in which bismuth (Bi) is doped, YIG ($LaY_2Fe_5O_{12}$) in which lanthanum (La) is added, yttrium gallium iron garnet ($Y_3Fe_{5-x}Ga_xO_{12}$) and the like are listed. Note that, from the viewpoint of suppressing the heat conduction caused by electrons, a magnetic insulator is preferably used.

The conductive film 30 is a spin current-electric current converting section which develops the inverse spin-Hall effect. Namely, the conductive film 30 generates an electromotive force from the above-mentioned spin current Js due to the inverse spin-Hall effect. Here, the direction of the generated electromotive force is given by the outer product of the direction of the magnetization M of the magnetic layer 20 and the direction of the temperature gradient ∇T (E//M×∇T). In this exemplary embodiment, in order to efficiently generate an electric power, the element is configured such that the direction of the electromotive force becomes the in-plane direction of the conductive film 30. For example, as shown in FIG. 2, the direction of the magnetization M of the magnetic layer 20 is the +y direction, the direction of the temperature gradient ∇T is the +z direction, and the direction of the electromotive force is the +x direction.

Typically, the conductive film 30 is a metal film. The material of the conductive film 30 includes a metal material in which the "Spin Orbit Coupling" is large. For example, the metal materials, such as Au, Pt, Pd and Ir in each of which the spin orbit coupling is relatively large, and the other metal material having the f-orbit, or an alloy material which includes them are used. Also, the similar effect can be obtained by only doping a material such as Au, Pt, Pd, Ir and the like into a typical material such as Cu and the like at about 0.5 to 10 weight %. Note that, the conductive film 30 may be an oxide such as ITO and the like.

Note that, from the viewpoint of efficiency, the film thickness of the conductive film 30 is desired to be set to an approximate level of the "spin diffusion length (spin relaxation length)" that depends on the material. For example, when the conductive film 30 is the Pt film, its film thickness is desired to be set to about 10 to 30 nm.

The terminal section 40 is formed to extract the electric current (electric power) generated in the conductive film 30. The terminal section 40 is formed so as to be in contact with the conductive film 30.

In detail, when the potential caused by the above-mentioned electromotive force generated in the conductive film 30 is considered, the two terminal sections 40-1 and 40-2 are formed to be in contact with the conductive film 30, at two positions whose potentials differ from each other, respectively. In the example of FIG. 2, the two terminal sections 40-1 and 40-2 are formed separately from each other in the x direction (electromotive force direction) on the conductive film 30. Note that, the material of the terminal section 40 may be same to or different from the material of the conductive film 30.

Moreover, those two terminal sections 40-1 and 40-2 are respectively linked to external connection wirings 50-1 and 50-2 different to each other. When the electromotive force is generated, the potentials of the terminal sections 40-1 and 40-2 differ from each other. Also, the potentials of the external connection wirings 50-1 and 50-2 differ from each other. By using the terminal sections 40-1 and 40-2 and the external connection wirings 50-1 and 50-2, it is possible to extract the electric current (electric power) generated in the conductive film 30.

Here, a current distribution in the conductive film 30 at the time of thermoelectric power generation is considered.

Figure 1:
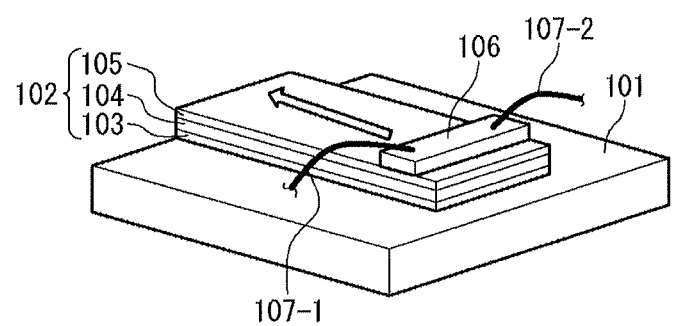
FIG. 1 is a perspective view schematically showing a thermoelectric conversion element described in Patent Literature 1.
Figure 3A:
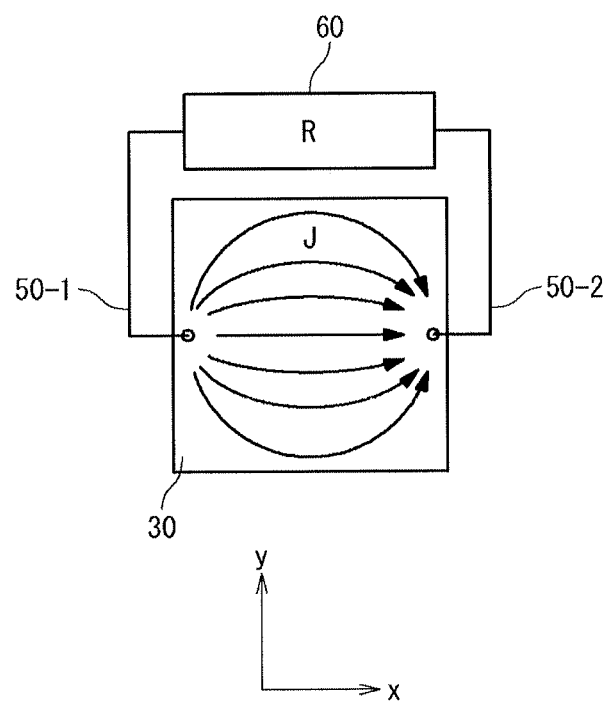
FIG. 3A schematically shows an electric current distribution on a conductive film in a case of a comparison example.
Figure 3B:
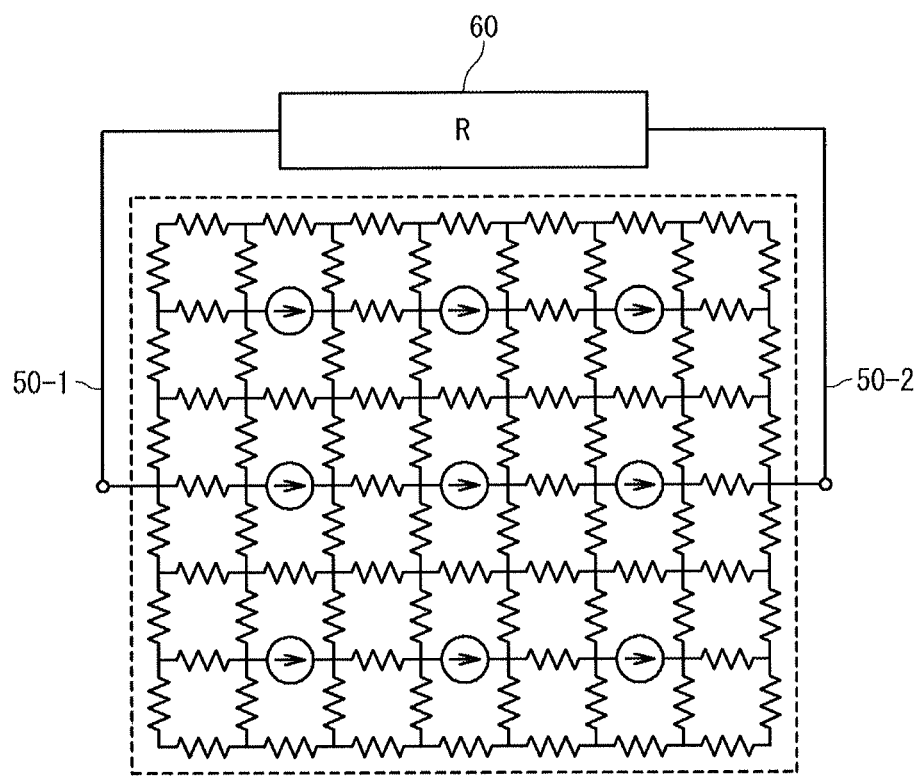
FIG. 3B schematically shows an equivalent circuit of a conductive film in a case of a comparison example.

At first, as a comparison example, let us consider a case of the point terminal type, as already shown in FIG. 1. Namely, in the comparison example, each external connection terminal is connected to the conductive film 30 at one point. This corresponds to a situation in which the terminal sections 40 are omitted from the configuration shown in FIG. 2. FIG. 3A schematically shows the current distribution in the conductive film 30 in the case of the comparison example. FIG. 3B schematically shows the equivalent circuit of the conductive film 30 in the case of the comparison example. The conductive film 30 can be virtually regarded as a circuit in which current sources and internal resistances are connected to each other. The external connection wirings 50-1 and 50-2 are connected to both ends of an external load 60, respectively.

As shown in FIG. 3A and FIG. 3B, in the case of the comparison example, the route of the current between the two terminals is long, so that the resistive loss (ohmic loss) in the conductive film 30 is large. In particular, although the amount of the electric power generation is effectively increased by making the area of the conductive film 30 large, as a result of the large area, the resistive loss in the conductive film 30 is further increased.

Then, according to this exemplary embodiment, the two terminal sections 40-1 and 40-2 are arranged to decrease the resistive loss (ohmic loss) in the conductive film 30. Specifically, the terminal sections 40-1 and 40-2 are formed such that the current route between the two terminal sections 40-1 and 40-2 becomes short. For example, as shown in FIG. 2, each of the terminal sections 40-1 and 40-2 is formed to extend in the y direction which is orthogonal to the x direction (electromotive force direction). Namely, each of the terminal sections 40-1 and 40-2 is in contact with the conductive film 30 on a contact surface extending in the y direction and not one point.

Figure 4A:
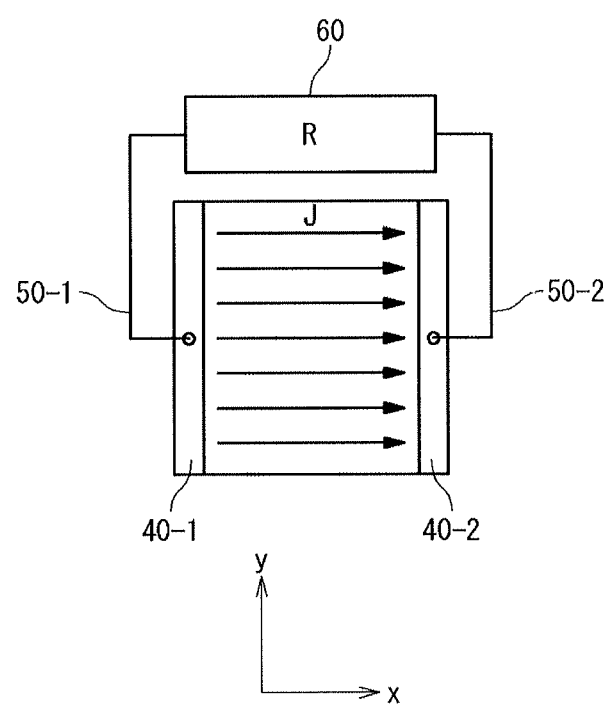
FIG. 4A schematically shows an electric current distribution on a conductive film in a case of an exemplary embodiment of the present invention.
Figure 4B:
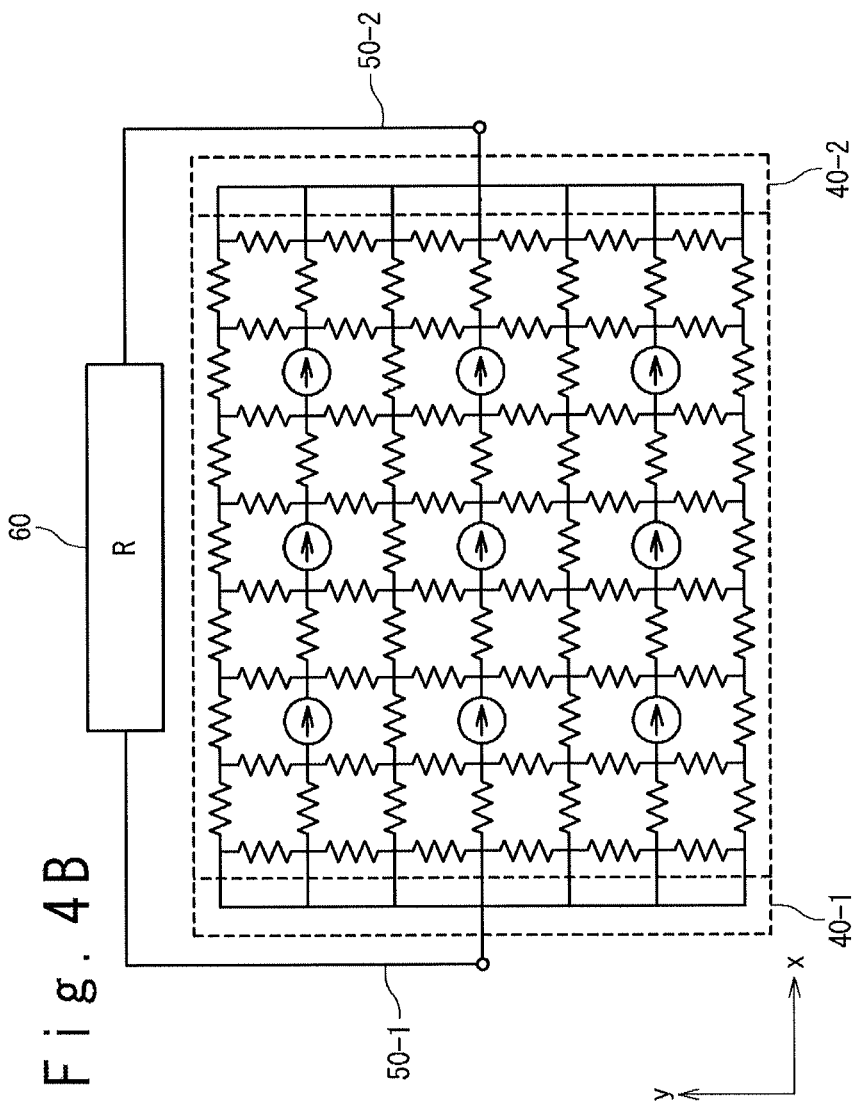
FIG. 4B schematically shows an equivalent circuit of a conductive film and a terminal portion in a case of an exemplary embodiment of the present invention.

FIG. 4A schematically shows the current distribution in the conductive film 30 in the case of the example shown in FIG. 2. FIG. 4B schematically shows the equivalent circuit of the conductive film 30 and the terminal sections 40 in the case of the example shown in FIG. 2. The terminal sections 40 extending along the y direction have a function to decrease the potential gradient in the y direction (equalizing the potentials). Consequently, the direction of the electric force line generated between the terminal sections 40-1 and 40-2, namely, the direction of the current flowing between the terminal sections 40-1 and 40-2 becomes approximately parallel to the x direction, and its route is minimized. Namely, as compared with the case of the comparison example, the route of the current flowing between the two terminals is made short. Thus, the resistive loss (ohmic loss) in the conductive film 30 is significantly decreased. As a result, it is possible to obtain larger amount of electric power generation than that of the case of the comparison example.

Note that, in the example shown in FIG. 2, the terminal section 40 is a film (hereinafter, referred to as a terminal film) formed to be in contact with the conductive film 30. The sheet resistance of this terminal film 40 is lower than the sheet resistance of the conductive film 30. Namely, it can be said that the terminal section 40 forms a region where the sheet resistance is low (refer to the equivalent circuit in FIG. 4B). In order to significantly decrease the sheet resistance, the film thickness of the terminal film 40 is preferred to be larger than the film thickness of the conductive film 30.

When the materials of the terminal film 40 and the conductive film 30 are same to each other, it is also possible to integrally form the terminal film 40 as a part of the conductive film 30. In the case of such integral structure, the conductive film 30 has two portions in which the film thickness is large. The sheet resistance of the portion, in which the film thickness is large, is lower than the sheet resistance of the other part. And those portions in which the film thickness is large function as the "terminal sections" that are connected to the external connection wirings 50-1 and 50-2, respectively.

2. Terminal Section 40

The configuration of the terminal section 40 is not limited to the configuration shown in FIG. 2. Other various configurations which can achieve same actions and effects may be considered. In the following description, various examples of the terminal film 40 will be described. In the explanation below, the direction of the electromotive force generated in the conductive film 30 is assumed to be the x direction.

2-1. First Configuration Example

Figure 5:
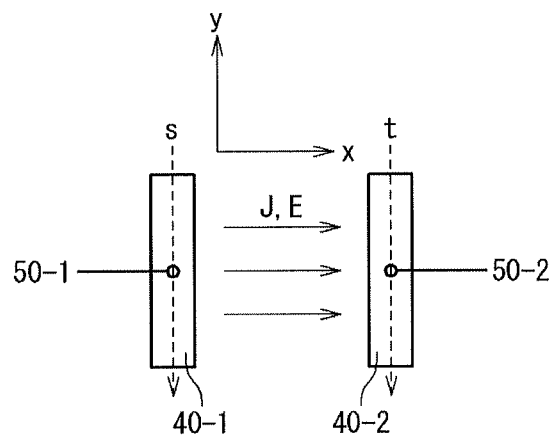
FIG. 5 is a plan view showing a structure example of a terminal portion according to an exemplary embodiment of the present invention.
Figure 6:
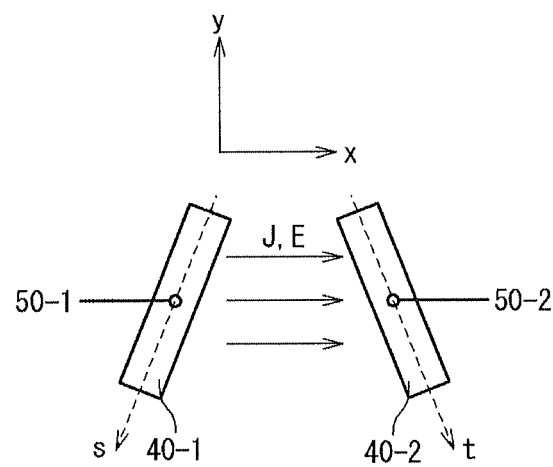
FIG. 6 is a plan view showing another structure example of a terminal portion according to an exemplary embodiment of the present invention.

FIG. 5 and FIG. 6 are plan views showing the terminal section 40 in the first configuration example. In the first configuration example, each terminal section 40 is a film (terminal film) that has a rectangular planar shape. Namely, each terminal section 40 is in contact with the conductive film 30 on the rectangular continuous contact surface.

Here, the longitudinal direction of the terminal section 40-1 is assumed to be the s-direction, and the longitudinal direction of the terminal section 40-2 is defined as the t-direction. According to this exemplary embodiment, each of the s-direction and the t-direction intersects with the x direction (electromotive force direction). Consequently, the aforementioned effect is obtained. In the example shown in FIG. 5, both of the s-direction and the t-direction are orthogonal to the x direction and parallel to each other. As shown in FIG. 6, the s-direction and the t-direction may not be orthogonal to the x direction and may not be parallel to each other. Even in the case of FIG. 6, an adequate effect can be obtained.

2-2. Second Configuration Example

Figure 7:
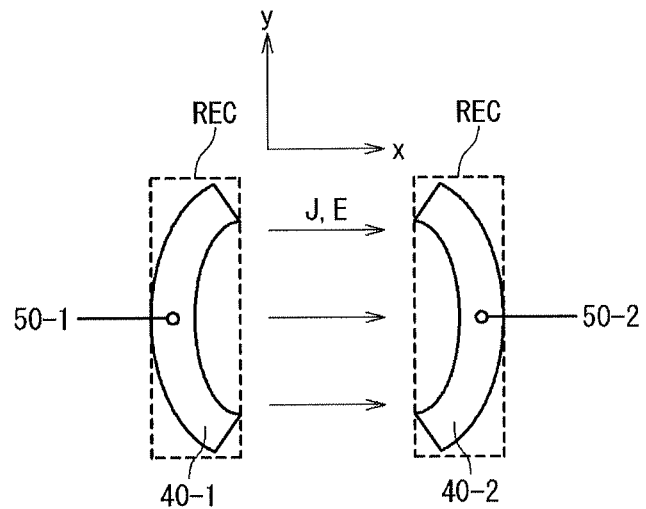
FIG. 7 is a plan view showing further another structure example of a terminal portion according to an exemplary embodiment of the present invention.
Figure 8:
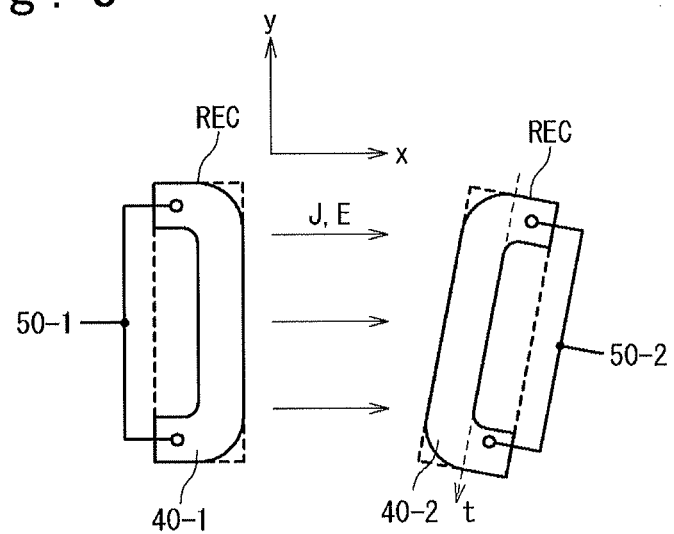
FIG. 8 is a plan view showing further another structure example of a terminal portion according to an exemplary embodiment of the present invention.

FIG. 7 and FIG. 8 are plan views showing the terminal section 40 in the second configuration example. The planar shape of the terminal section 40 is not limited to the rectangle and may be curved as shown in FIG. 7 and FIG. 8. As the longitudinal directions (s and t) in this case, the longitudinal direction of the minimum rectangle REC that encompasses the continuous contact plane between each terminal section 40 and the conductive film 30 is considered. The longitudinal directions (s and t) of the minimum rectangle REC intersect with the x direction (electromotive force direction). Consequently, the similar effect is obtained.

2-3. Third Configuration Example

Figure 9:
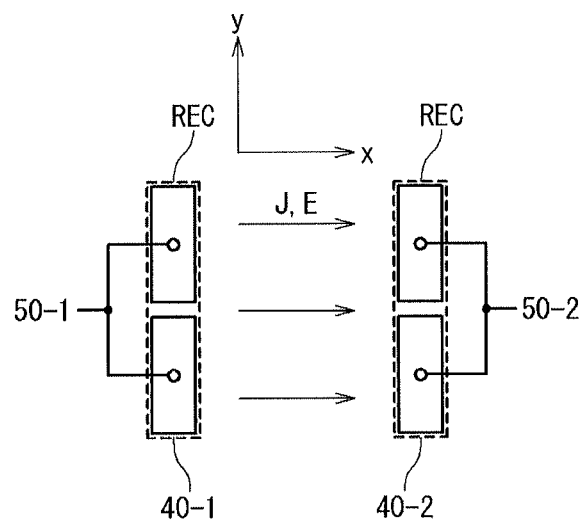
FIG. 9 is a plan view showing further another structure example of a terminal portion according to an exemplary embodiment of the present invention.
Figure 10:
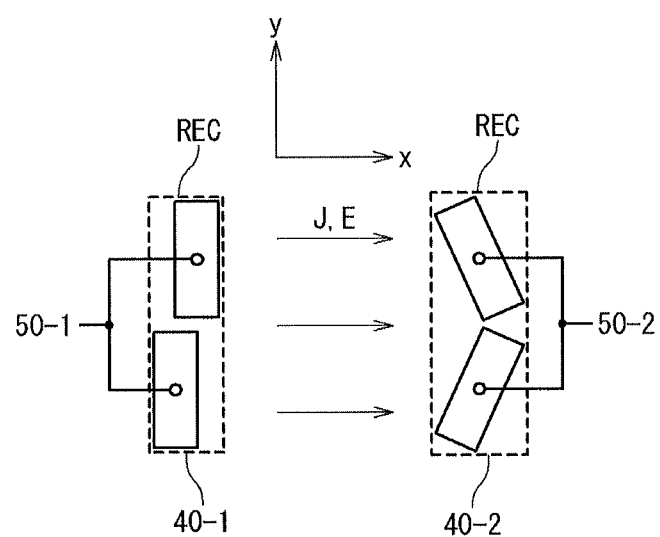
FIG. 10 is a plan view showing further another structure example of a terminal portion according to an exemplary embodiment of the present invention.

FIG. 9 and FIG. 10 are plan views showing the terminal section 40 in the third configuration example. As shown in FIG. 9 and FIG. 10, the terminal film, which forms each terminal section 40, may be divided into a plurality of parts. All of the parts of the terminal section 40-1 are linked to the same external connection wiring 50-1, and all of the parts of the terminal section 40-2 are linked to the same external connection wiring 50-2. As the longitudinal directions (s and t) in this case, the longitudinal direction of the minimum rectangle REC that encompasses all of the contact planes between each terminal section 40 and the conductive film 30 is considered. The longitudinal directions (s and t) of the minimum rectangle REC intersect with the x direction (electromotive force direction). Consequently, the similar effect is obtained.

2-4. Fourth Configuration Example

Figure 11:
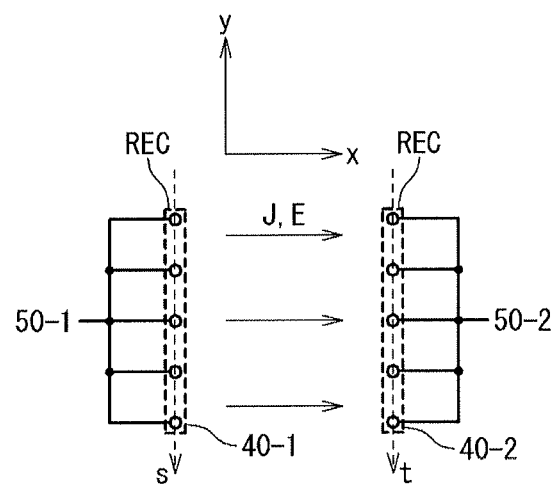
FIG. 11 is a plan view showing further another structure example of a terminal portion according to an exemplary embodiment of the present invention.
Figure 12:
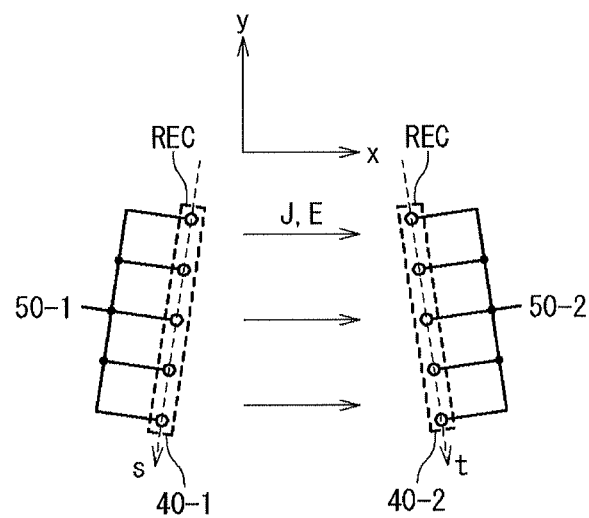
FIG. 12 is a plan view showing further another structure example of a terminal portion according to an exemplary embodiment of the present invention.

FIG. 11 and FIG. 12 are plan views showing the terminal section 40 in the fourth configuration example. The terminal section 40 is not necessarily required to be in contact with the conductive film 30 on a continuous contact plane. As shown in FIG. 11 and FIG. 12, each terminal section 40 may be composed of a plurality of terminals arranged in a line. In other words, each terminal section 40 may be in contact with the conductive film 30 on a "discrete" contact plane. All of the terminals that configure the terminal section 40-1 are linked to a same external connection wiring 50-1, and all of the terminals that configure the terminal section 40-2 are linked to a same external connection wiring 50-2.

As the longitudinal directions (s and t) in this case, the longitudinal direction of the minimum rectangle REC that encompasses the plurality of terminals which configure each terminal section 40, namely, the minimum rectangle REC that encompasses the discrete contact plane between each terminal section 40 and the conductive film 30 is considered. The longitudinal directions (s and t) of the minimum rectangle REC intersect with the x direction (electromotive force direction). Consequently, the similar effect is obtained.

2-5. Fifth Configuration Example

Figure 13:
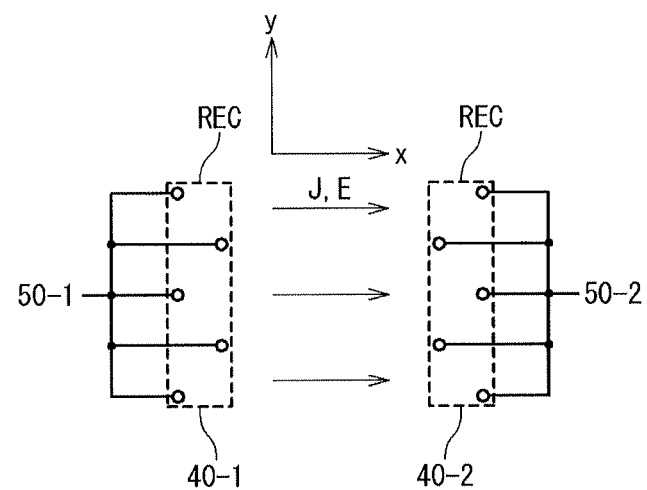
FIG. 13 is a plan view showing further another structure example of a terminal portion according to an exemplary embodiment of the present invention.
Figure 14:
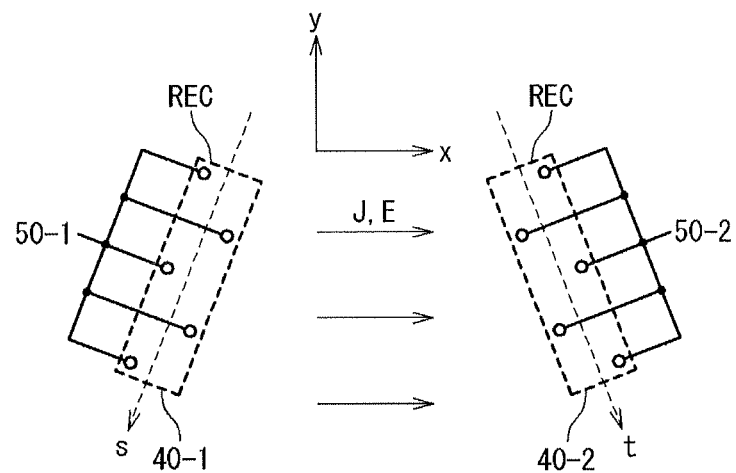
FIG. 14 is a plan view showing further another structure example of a terminal portion according to an exemplary embodiment of the present invention.

FIG. 13 and FIG. 14 are plan views showing the terminal section 40 in the fifth configuration example. The plurality of terminals that configure the terminal section 40 may not be arrayed in a line and may be arranged in "zigzag". Also, the longitudinal direction in this case is the longitudinal direction of the minimum rectangle REC that encompasses the plurality of terminals which configure each terminal section 40, namely, the minimum rectangle REC that encompasses the discrete contact plane between each terminal section 40 and the conductive film 30 is considered. The longitudinal directions (s and t) of the minimum rectangle REC intersect with the x direction (electromotive force direction). Consequently, the similar effect is obtained.

2-6. Sixth Configuration Example

Figure 15:
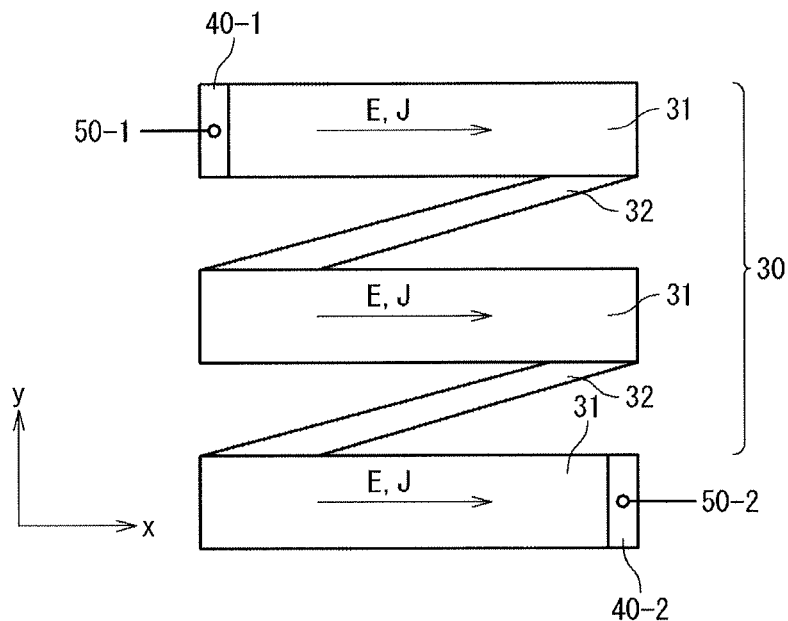
FIG. 15 is a plan view showing further another structure example of a terminal portion according to an exemplary embodiment of the present invention.
Figure 16:
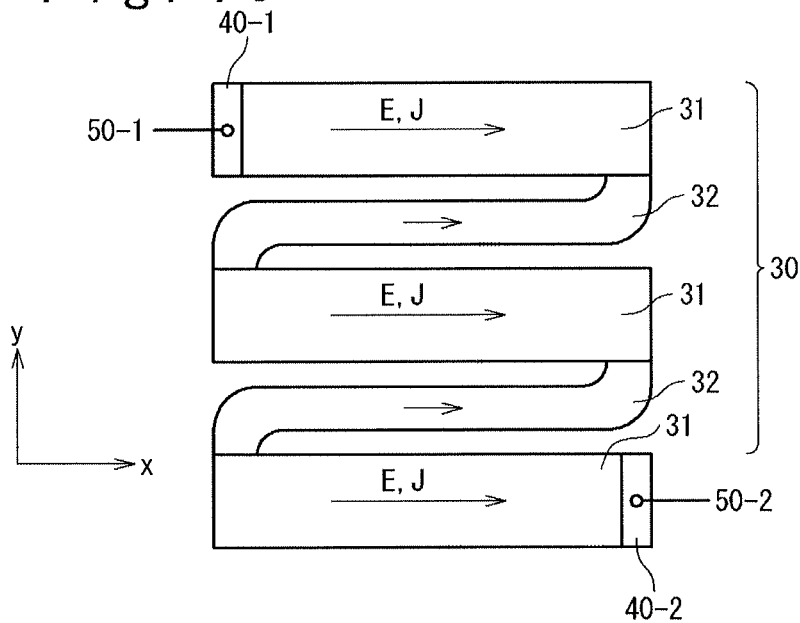
FIG. 16 is a plan view showing further another structure example of a terminal portion according to an exemplary embodiment of the present invention.

In the examples shown in FIG. 15 and FIG. 16, the conductive film 30 contains: a plurality of electric power generation sections 31; and link sections 32 which connect between the plurality of electric power generation sections 31. Each of the electric power generation sections 31 is formed to extend in the x direction. Each of the link sections 32 connects the plurality of electric power generation sections 31 so that the electromotive forces generated in the plurality of respective electric power generation sections 31 are added to one another in series. Further, the electric power generation amount in the link section 32 is smaller than the electric power generation amount in the electric power generation section 31. For example, the area of the link section 32 is smaller than the area of the electric power generation section 31. Or, the electric power generation section 31 and the link section 32 are different in material. With regard to the spin current-electric current conversion efficiency, the link section 32 may be lower than the electric power generation section 31.

Even for such a conductive film 30, the terminal sections 40-1 and 40-2 according to this exemplary embodiment can be applied. That is, the two terminal sections 40-1 and 40-2 are formed to be in contact with two positions which are different in potential in the conductive film 30, respectively. Then, the longitudinal direction of the minimum rectangle REC that encompasses the contact plane between each terminal section 40 and the conductive film 30 intersect with the x direction (electromotive force direction). Consequently, the similar effect is obtained.

2-7. Seventh Configuration Example

Figure 17:
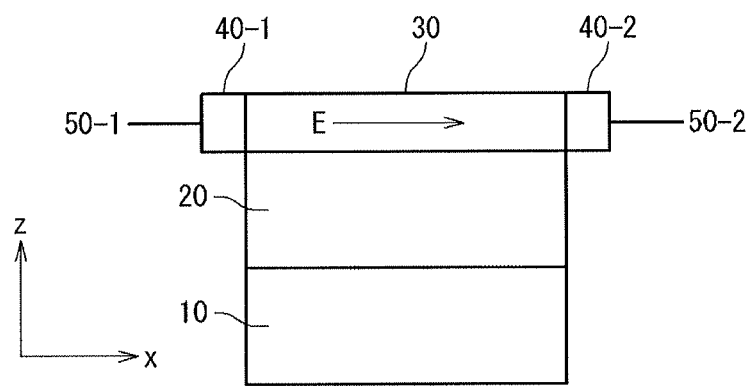
FIG. 17 is a plan view showing further another structure example of a terminal portion according to an exemplary embodiment of the present invention.
Figure 18:
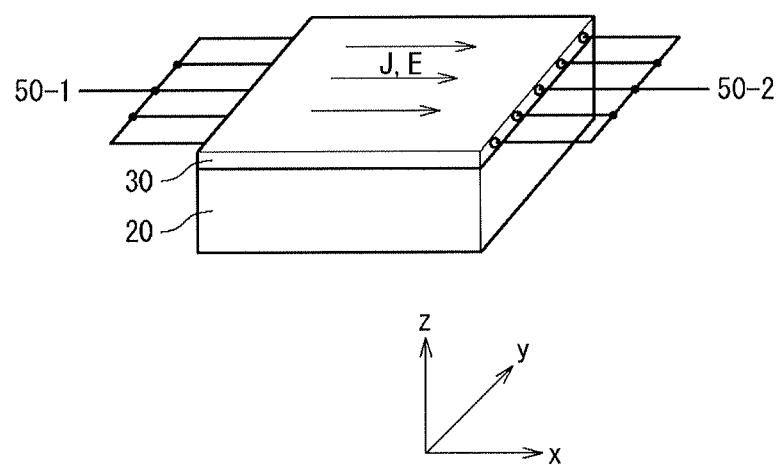
FIG. 18 is a plan view showing further another structure example of a terminal portion according to an exemplary embodiment of the present invention.

As shown in FIG. 17 and FIG. 18, the terminal sections 40 may be formed on the side surface of the conductive film 30. In the example shown in FIG. 18, a plurality of terminals as indicated in the fourth configuration example (refer to FIG. 11 and FIG. 12) are formed on the side of the conductive film 30. Even in this configuration, the similar effect is obtained.

2-8. Eighth Configuration Example

Any combination of the above-explained configuration examples can also be adopted. For example, one of the terminal sections 40-1 and 40-2 may have the configuration shown in FIG. 5, and the other may have the configuration shown in FIG. 11.

The above configuration examples can be generally described as follows. The two terminal sections 40-1 and 40-2 are formed to be in contact with the conductive film 30 at two positions which are different in the potential caused by the electromotive force, respectively. Each of the terminal sections 40-1 and 40-2 is in contact with the conductive film 30 on a continuous or discrete contact plane. When the longitudinal direction of the minimum rectangle REC that encompasses the continuous or discrete contact plane is considered, the longitudinal direction with regard to each terminal section 40 intersects with the direction (x direction) of the electromotive force.

3. Other Examples

Figure 19:
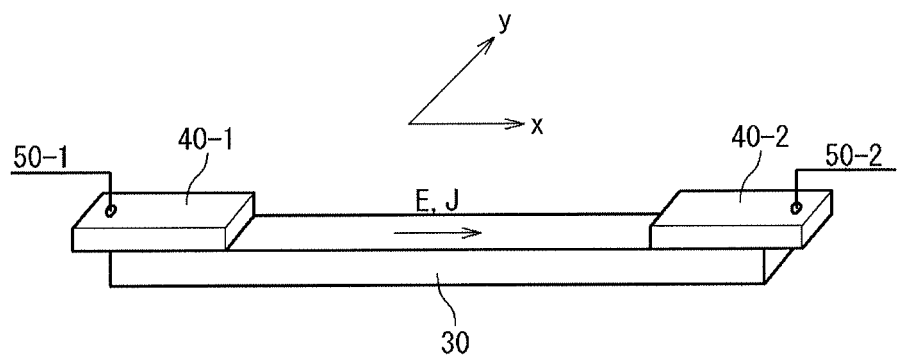
FIG. 19 is a plan view showing further another structure example of a terminal portion according to an exemplary embodiment of the present invention.

FIG. 19 shows another example. The conductive film 30 extends in an elongated shape in the x direction. The terminal sections 40 are formed on the conductive film 30. In this exemplary embodiment, the longitudinal direction of the contact plane between the terminal section 40 and the conductive film 30 coincides with the direction (x direction) of the electromotive force. Even in this case, by setting the width of the terminal section 40 and the width of the conductive film 30 to be equal, the resistive loss in the conductive film 30 can be suppressed to the minimum.

Figure 20:
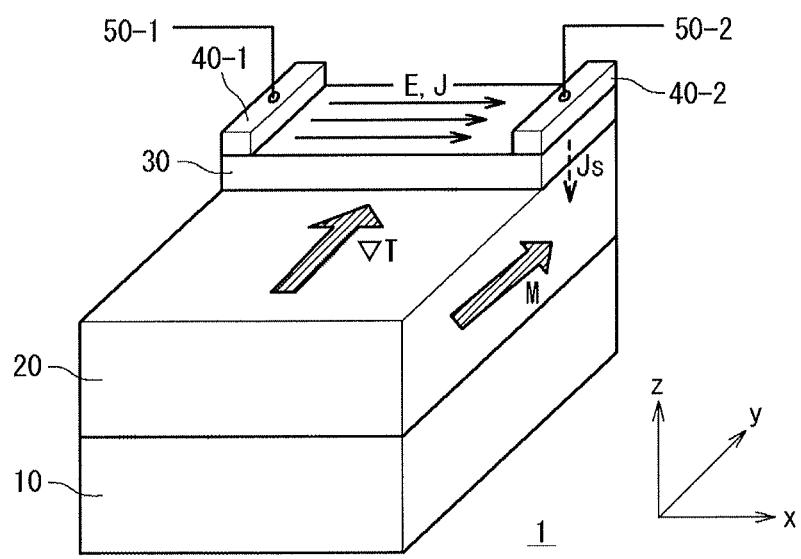
FIG. 20 is a perspective view schematically showing another structure of a thermoelectric conversion element according to an exemplary embodiment of the present invention.

FIG. 20 shows still another example. In the configuration shown in FIG. 20, the temperature gradient $\nabla T$ is given to the in-plane direction (y direction) and not to the lamination direction (z direction). In detail, the magnetic layer 20 is formed to extend in the y direction, and the conductive film 30 is formed on a part of the magnetic layer 20. When the temperature gradient $\nabla T$ in the y direction is applied, the spin current Js along the y direction is generated in the magnetic layer 20. Then, on the interface between the magnetic layer 20 and the conductive film 30, the direction of the spin current Js is changed to the z direction. Thus, similarly to the case of the aforementioned exemplary embodiments, the electromotive force is generated in the x direction in the conductive film 30. The relation between the conductive film 30 and the terminal section 40 is same to the case of the aforementioned exemplary embodiments.

4. Conductive Film 30

Figure 21:
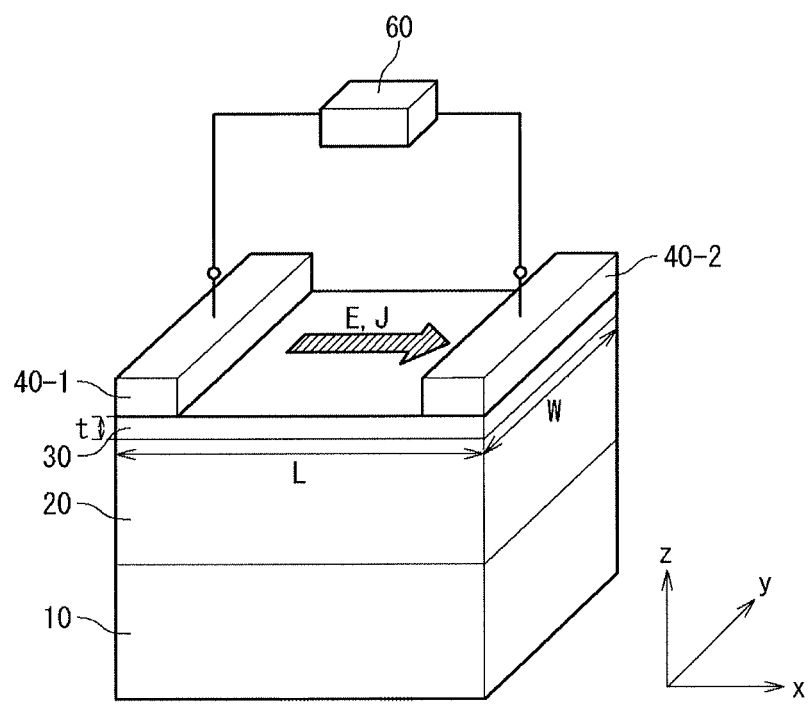
FIG. 21 is a perspective view showing a thermoelectric conversion element according to an exemplary embodiment of the present invention.
Figure 22:
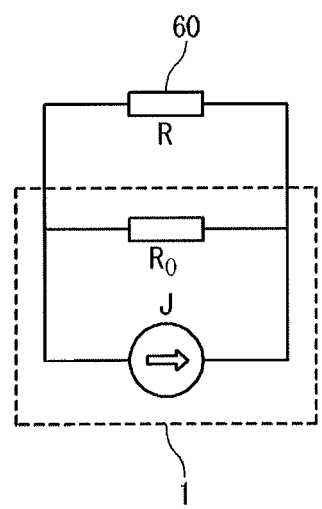
FIG. 22 is a circuit diagram showing an equivalent circuit of a thermoelectric conversion element according to an exemplary embodiment of the present invention.

As shown in FIG. 21 and FIG. 22, let us consider a case in which the external load 60 of a resistance R is connected to the thermoelectric conversion element 1 and then, the electric power is transmitted to the external load 60. At this time, the internal resistance $R_o$ of the thermoelectric conversion element 1 is approximately given by the resistance of the conductive film 30.

As shown in FIG. 21, the length of the conductive film 30 in the x direction, the width in the y direction and the thickness in the z direction are represented by L, W and t, respectively. Using the resistivity ρ of the conductive film 30, the internal resistance $R_o$ is represented as $R_o=\rho L/(Wt)$. However, the thickness t of the conductive film 30 is desired to be set to the approximate level of the spin diffusion length of the material. Thus, for designing an element structure, usually, the sheet resistance $R_s=\rho/t$ is treated as a fixed parameter.

Here, when the external load 60 of the resistance R is connected, the condition of impedance matching is represented as $R=R_o=R_s L/W$. In order to satisfy this impedance matching condition, the shape parameters L and W of the thermoelectric conversion element 1 are preferably designed to satisfy the relation $L/W=R/R_s$. By satisfying such a relation, the electric power generation amount (electric power supply amount) per given area can be maximized.

For example, when a Pt film which has the film thickness of t=15 nm is used as the conductive film 30, the sheet resistance $R_s$ becomes $R_s=\rho/t=6.9$ Ω/□. When a case of driving the external load 60 having resistance R=10Ω is assumed, the optimal aspect ratio of the thermoelectric conversion element 1 becomes $L/W=R/R_s=1.4$. Thus, it is found that the element shape close to the square is desired.

Note that, when the optimal aspect ratio L/W is extremely large, a folding structure shown in, for example, FIG. 15 or FIG. 16 is preferably employed.

Further, one of the merits of the thermoelectric conversion element 1 which uses the spin current as described in this exemplary embodiment lies in a useful scaling law, in which the thermoelectric power generation of a larger output can be obtained by setting the area larger. This scaling law of the thermoelectric power generation is described below in more detail.

When the length L is set larger with keeping the width W of the conductive film 30 constant, the thermal electromotive force V (the output voltage when the portion between output terminals is opened without any connection of the external load 60) and the internal resistance $R_o$ are increased proportionally to the length L ($V \propto L$ and $R_o \propto L$). Further, when the width W is set larger with keeping the length L of the conductive film 30 constant, though the thermal electromotive force V is not changed, the internal resistance $R_o$ is decreased inverse-proportionally to the width W ($R_o \propto 1/W$). Thus, when the impedance matching is suitably performed, the optimal electric power ($\propto V^2/R_o$) that can be extracted in the external load 60 is approximately proportional to the area L×W of the conductive film 30.

In this way, in the thermoelectric conversion element 1 that uses the spin current, as the area (L×W) is set larger, the more spin current is flown into the conductive film 30 and contributes to the electric power generation. As a result, the more electrical energy can be obtained. In order to obtain larger electric power generation amount (electric power), as described in this exemplary embodiment, a structure in which the area of the conductive film 30 is maximized with respect to the magnetic layer 20 is desired.

Figure 23:
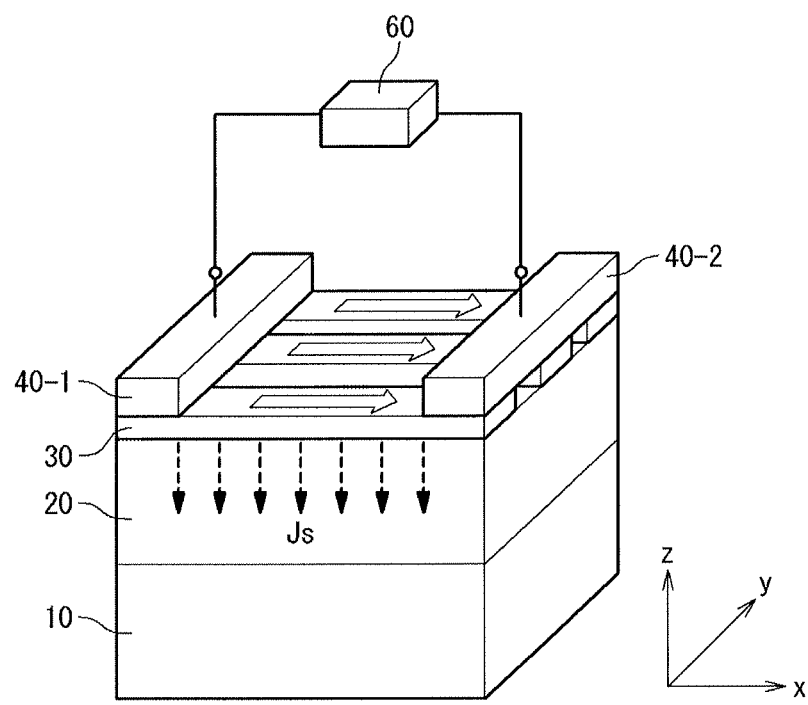
FIG. 23 is a perspective view showing another example of a thermoelectric conversion element according to an exemplary embodiment of the present invention.

Further, the conductive film 30 is not necessarily required to be integrated. For example, as shown in FIG. 23, the conductive film 30 may be divided into a plurality of parts and arranged. In this case, the respective thermal electromotive forces (electric power generations) in the separated conductive films 30 are collectively extracted by the terminal sections 40-1 and 40-2.

In the above, some exemplary embodiments of the present invention have been described with reference to the accompanying drawings. However, the present invention is not limited to the above-explained exemplary embodiments and can be properly modified by one skilled in the art in a range without departing from the scope.

A part or all of the above-mentioned exemplary embodiments can be described as indicated in the following supplementary notes. However, they are not limited to the followings.

(Supplementary Note 1)

A thermoelectric conversion element including:

a magnetic layer;

a conductive film formed on the magnetic layer and configured to generate an electromotive force in an in-plane direction by inverse spin-Hall effect; and two terminal sections formed to contact with the conductive film at two portions whose potentials are different to each other by the electromotive force, wherein each of the two terminal sections contacts with the conductive film in a continuous or discrete contact surface, and a longitudinal direction of a minimum rectangle which encompasses the continuous or discrete contact surface of each of the two terminal sections intersects with the direction of the electromotive force.

(Supplementary Note 2)

The thermoelectric conversion element described in the supplementary note 1, wherein at least one of the two terminal sections is a terminal film formed to contact with the conductive film.

(Supplementary Note 3)

3. The thermoelectric conversion element described in the supplementary note 2, wherein a sheet resistance of the terminal film is lower than a sheet resistance of the conductive film.

(Supplementary Note 4)

The thermoelectric conversion element described in the supplementary note 1, wherein at least one of the two terminal sections contacts with the conductive film in the discrete contact surface.

(Supplementary Note 5)

The thermoelectric conversion element described in any of the supplementary notes 1 to 4, wherein the two terminal sections is connected to different external connection wirings respectively.

(Supplementary Note 6)

The thermoelectric conversion element described in any of the supplementary notes 1 to 5, wherein the magnetic layer is configured to generate a spin current from a temperature gradient by spin-Seebeck effect, and the conductive film is configured to generate the electromotive force from the spin current by inverse spin-Hall effect.

(Supplementary Note 7)

A thermoelectric conversion element including:

a magnetic layer;

a conductive film formed on the magnetic layer and configured to generate an electromotive force in an in-plane direction by inverse spin-Hall effect; and the conductive film comprises two terminal sections at two portions whose potentials are different to each other by the electromotive force, and a sheet resistance of the two terminal sections is lower than a sheet resistance of a part other than the two terminal sections.

(Supplementary Note 8)

A thermoelectric conversion element including:

a magnetic layer;

a conductive film formed on the magnetic layer and configured to generate an electromotive force in an in-plane direction by inverse spin-Hall effect; and two terminal sections formed to contact with the conductive film at two portions whose potentials are different to each other by the electromotive force, wherein the two terminal sections and the conductive film is same in a width of an in-plane direction intersecting with a direction of the electromotive force.

This application claims a priority based on Japanese Patent Application No. 2011-209727, which was filed on Sep. 26, 2011, and the disclosure of which is hereby incorporated into the present application by this reference.

The invention claimed is:

1. A thermoelectric conversion element comprising: a magnetic layer; a conductive film formed on the magnetic layer and configured to generate an electromotive force in an in-plane direction by inverse spin-Hall effect; and two terminal sections formed to contact with the conductive film at two portions whose potentials are different to each other by the electromotive force, wherein each of the two terminal sections contacts with the conductive film in a continuous or discrete contact surface, and a longitudinal direction of a minimum rectangle which encompasses the continuous or discrete contact surface of each of the two terminal sections intersects with the direction of the electromotive force, and wherein the two terminal sections and the conductive film is same in a width of an in-plane direction intersecting with a direction of the electromotive force;

Wherein the two terminal sections are terminal films formed to contact with the conductive film and having a thickness greater than the conductive film; and Wherein the width of the two terminal films is substantially the same as the width of the conductive film intersecting an in plane direction with a direction of the electromotive force.

2. The thermoelectric conversion element according to claim 1, wherein a sheet resistance of the terminal film is lower than a sheet resistance of the conductive film.

3. The thermoelectric conversion element according to claim 1, wherein at least one of the two terminal sections contacts with the conductive film in the discrete contact surface.

4. The thermoelectric conversion element according to claim 1, wherein the two terminal sections is connected to different external connection wirings respectively.

5. The thermoelectric conversion element according to claim 1, wherein the magnetic layer is configured to generate a spin current from a temperature gradient by spin-Seebeck effect, and the conductive film is configured to generate the electromotive force from the spin current by inverse spin-Hall effect.

* * * * *